(12) United States Patent
Wang (10) Patent No.: US 10,219,396 B2
(45) Date of Patent: Feb. 26, 2019

(54) CARD TRAY AND METHOD OF MAKING THE SAME

(71) Applicant: FOXCONN INTERCONNECT TECHNOLOGY LIMITED, Grand Cayman (KY)

(72) Inventor: Yong-Qi Wang, Huaian (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/462,937

(22) Filed: Mar. 20, 2017

(65) Prior Publication Data

US 2017/0273204 A1    Sep. 21, 2017

(30) Foreign Application Priority Data

Mar. 18, 2016 (CN) .......................... 2016 1 0155335

(51) Int. Cl.
| H05K 5/02 | (2006.01) |
| H05K 5/04 | (2006.01) |
| H05K 7/14 | (2006.01) |
| H04B 1/3816 | (2015.01) |

(52) U.S. Cl.
CPC ......... *H05K 5/0286* (2013.01); *H04B 1/3816* (2013.01); *H05K 5/04* (2013.01); *H05K 7/1427* (2013.01)

(58) Field of Classification Search
CPC ...... H05K 5/0286; H05K 5/04; H05K 7/1427; H05K 5/0269; H05K 7/1424; H05K 7/1461; H05K 7/1418; H04B 1/3816; G06F 1/1656; G06F 11/3031

USPC ..... 361/600, 679.01, 679.02, 724, 725, 727, 361/737, 752
See application file for complete search history.

(56) References Cited

U.S. PATENT DOCUMENTS

| 9,077,109 B1 | 7/2015 | Lin et al. | |
| 9,445,521 B2 | 9/2016 | Molex | |
| 2015/0056851 A1* | 2/2015 | Zhang ................. | H04B 1/3816 439/527 |
| 2016/0111802 A1* | 4/2016 | Shimotsu ........... | H01R 12/7076 439/159 |
| 2016/0164226 A1* | 6/2016 | Hirata ................. | H04B 1/3816 439/155 |

FOREIGN PATENT DOCUMENTS

CN            105072225        * 11/2015

OTHER PUBLICATIONS

Xiong Ying, Wu Fenghui, "Card support and mobile phone", Nov. 18, 2015, Beijing Xiaomi Technology Co., Entire Document (Translation of CN 105072225).*

* cited by examiner

*Primary Examiner* — Jerry Wu
*Assistant Examiner* — Stephen S Sul
(74) *Attorney, Agent, or Firm* — Wei Te Chung; Ming Chieh Chang (57) ABSTRACT

A card tray includes a base portion having a receiving cavity; an operating portion located at a rear end of the base portion; and a metal shell riveted to the operating portion. The operating portion together with the metal shell is insert-molded with the base portion to affix the operating portion to the base portion. The metal shell has plural legs affixed to the operating portion and embedded in the base portion.

10 Claims, 9 Drawing Sheets

CARD TRAY AND METHOD OF MAKING THE SAME

BACKGROUND OF THE INVENTION

1. Field of the Invention

The present invention relates to a card tray and a method of making the same.

2. Description of Related Arts

U.S. Pat. No. 9,077,109, issued on Jul. 7, 2015, discloses a card tray including a rectangular base board, a front cover body, and a pair of fixing pins mounting the front cover body to the rectangular base board. U.S. Pat. No. 9,445,521, issued on Sep. 13, 2016, discloses a card tray including an insulative frame body, a metal bottom plate, a mounting block, and an operating handle. The insulative frame body and the metal bottom plate may be integrally injection molded.

It is a disadvantage for an operating end of a card tray to be made of insulative material due to ease of damage.

SUMMARY OF THE INVENTION

A card tray comprises: a base portion having a receiving cavity; an operating portion located at a rear end of the base portion; and a metal shell riveted to the operating portion, the operating portion together with the metal shell being insert-molded with the base portion to affix the operating portion to the base portion, the metal shell having a plurality of legs affixed to the operating portion and embedded in the base portion. A method of making a card tray comprises the steps of: providing an operating portion and a metal shell; riveting the operating portion to the metal shell; and insert-molding a base portion with the operating portion and the metal shell to form a frame structure around the metal shell.

Other objects, advantages and novel features of the invention will become more apparent from the following detailed description when taken in conjunction with the accompanying drawings.

DETAILED DESCRIPTION OF THE PREFERRED EMBODIMENT

Referring to FIGS. 1 to 7(B), a card tray 100 is used to receive a electronic card (not labeled) and assembled to an electrical device (not labeled). For convenience, a left-and-right direction, a front-and-back direction, and an up-and-down direction are defined referring to FIG. 1.

Figure 1:
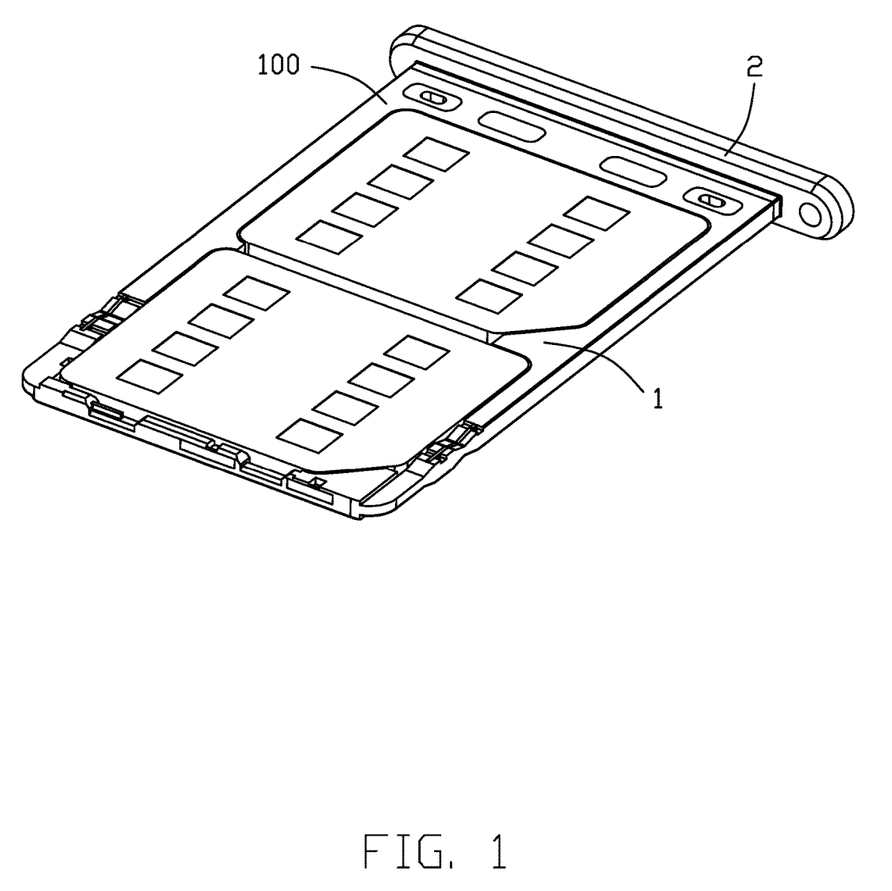
FIG. 1 is a perspective view of a card tray receiving two electronic cards.
Figure 2:
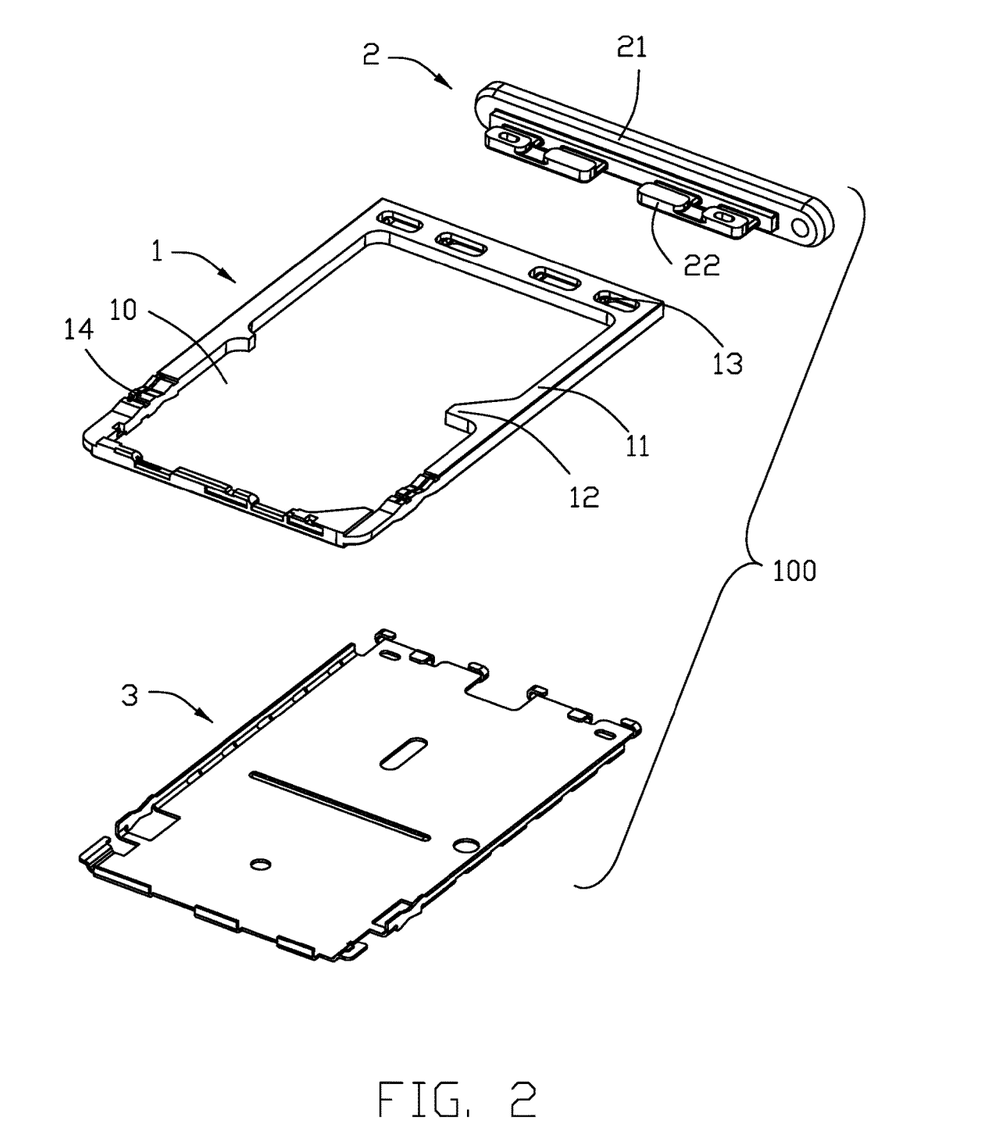
FIG. 2 is a perspective, exploded view of the card tray.
Figure 3:
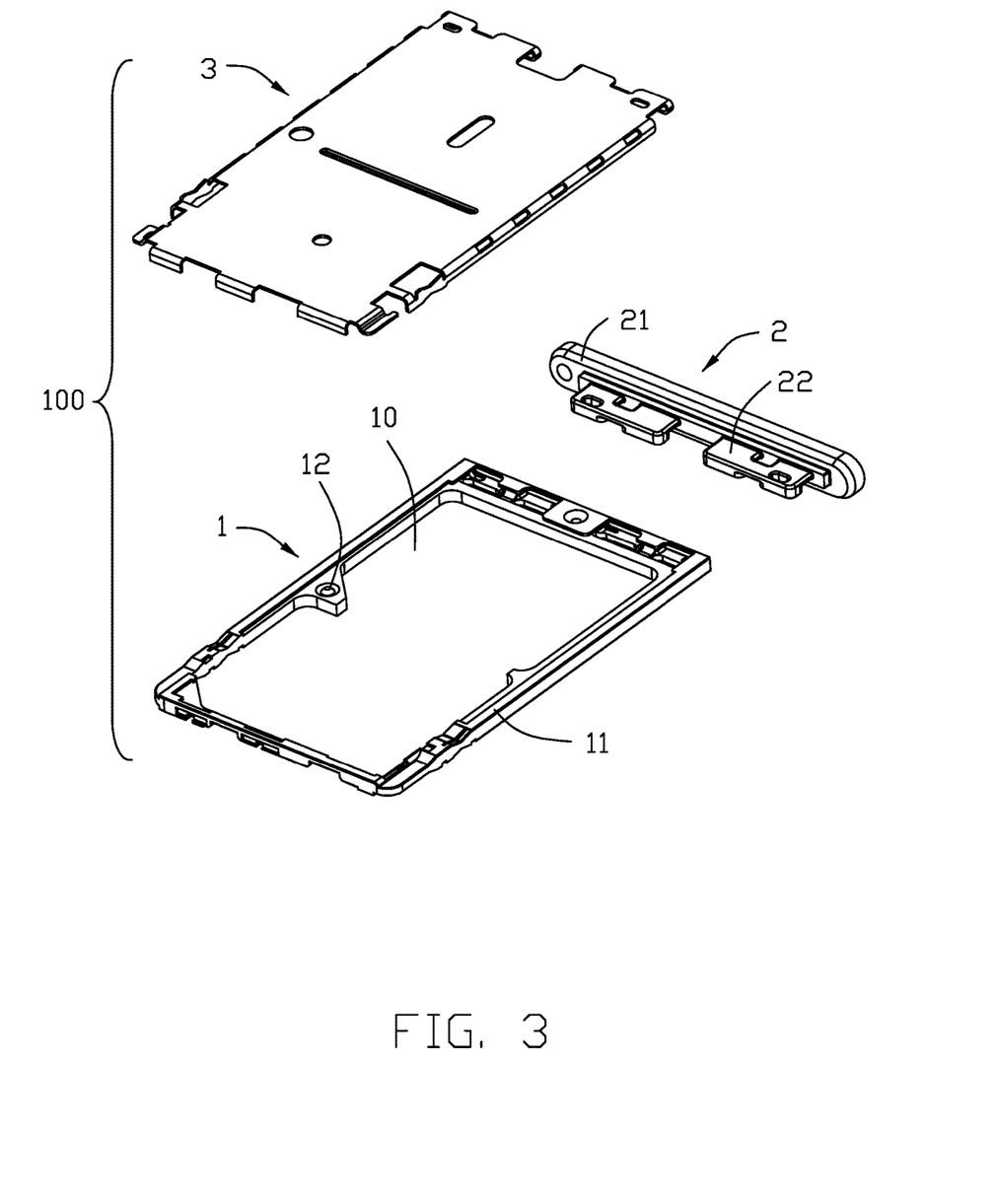
FIG. 3 is a perspective, exploded view referring to FIG. 2.
Figure 4:
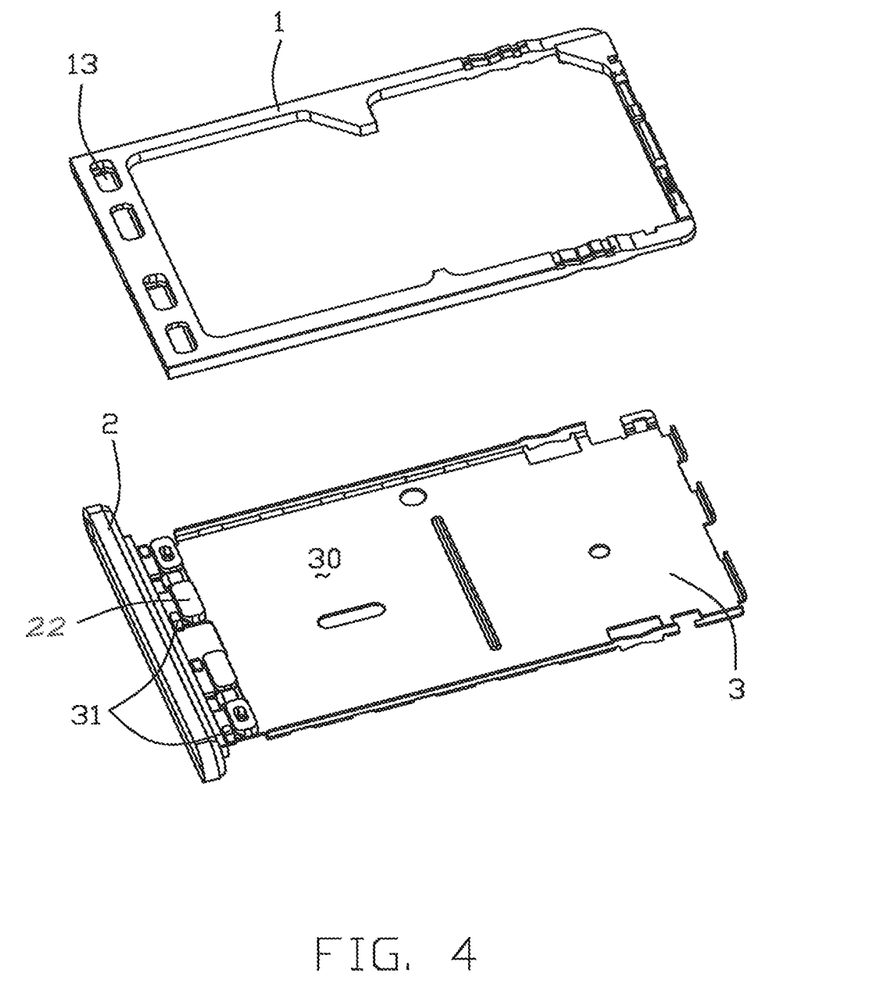
FIG. 4 is a perspective, partly exploded view referring to FIG. 2.
Figure 5:
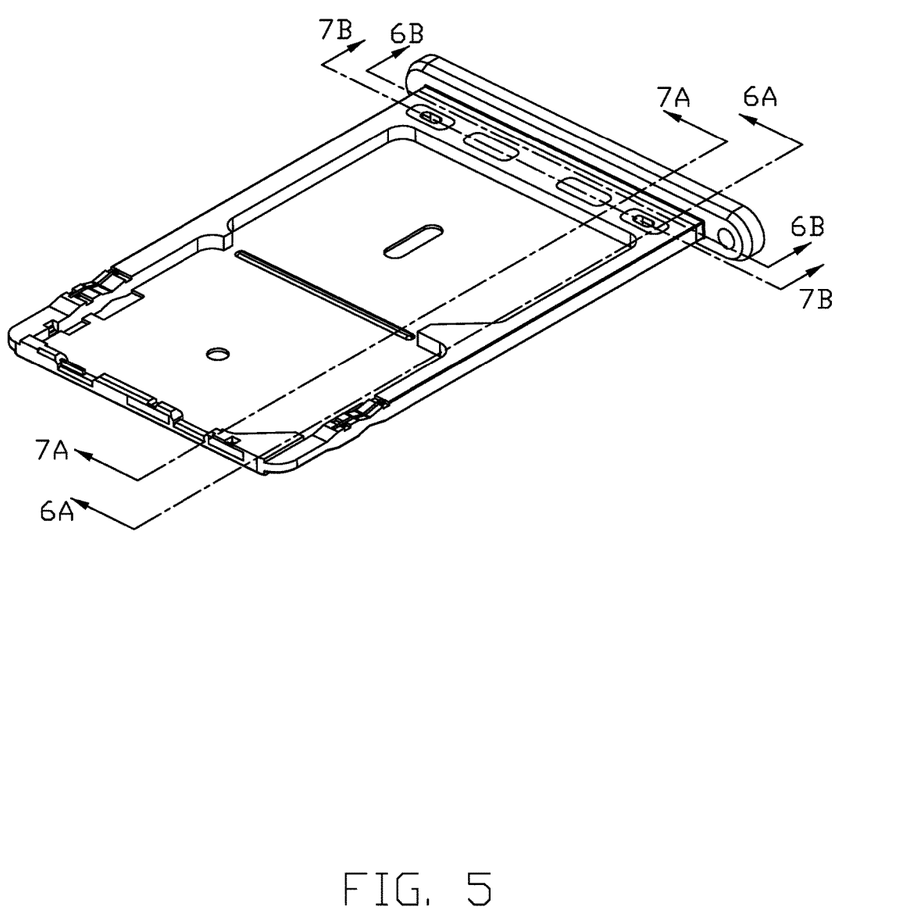
FIG. 5 is a perspective view of the card tray of FIG. 1.
Figure 6A:
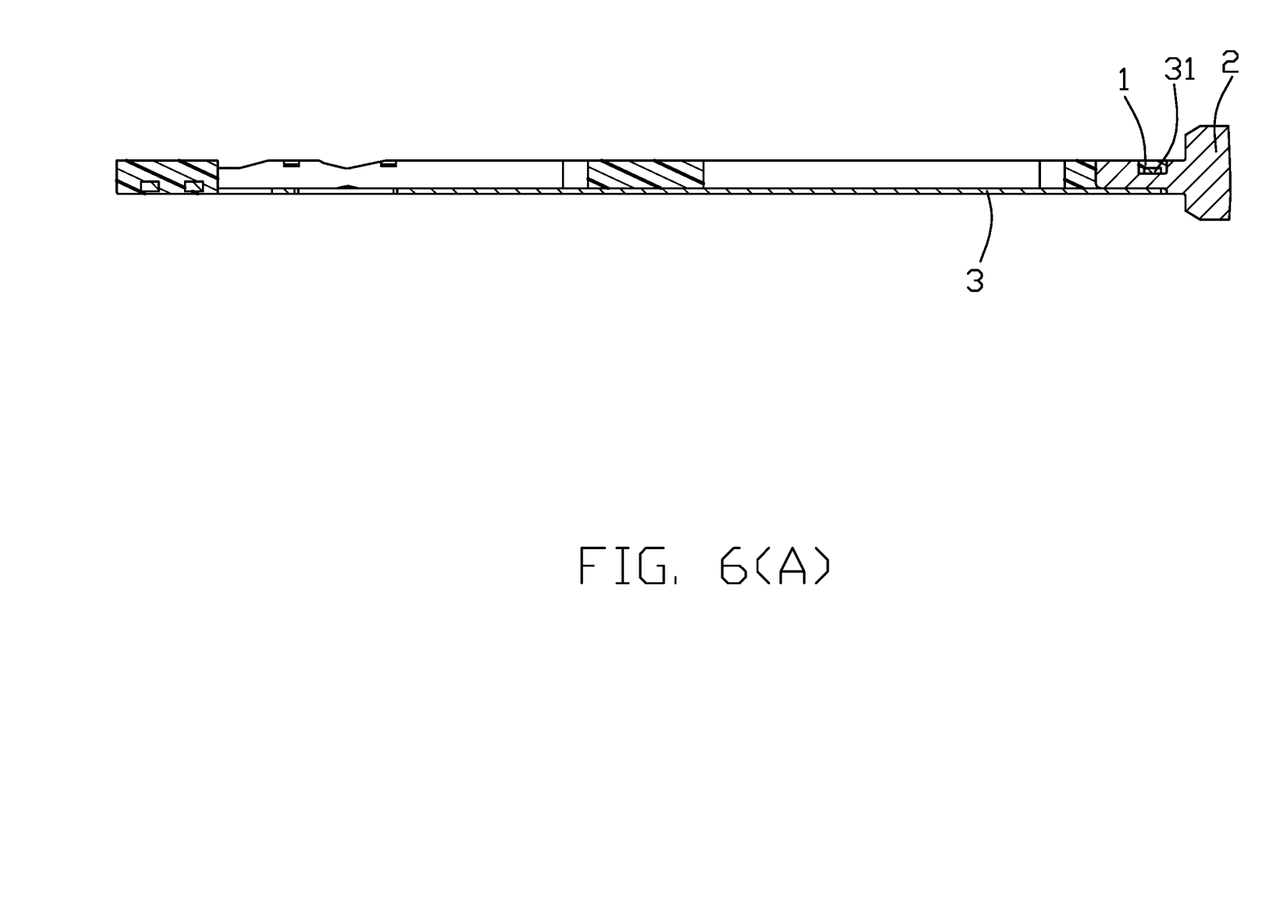
FIG. 6(A) is a cross-sectional view of the card tray of FIG. 5 along line 6(A)-6(B)
Figure 6B:
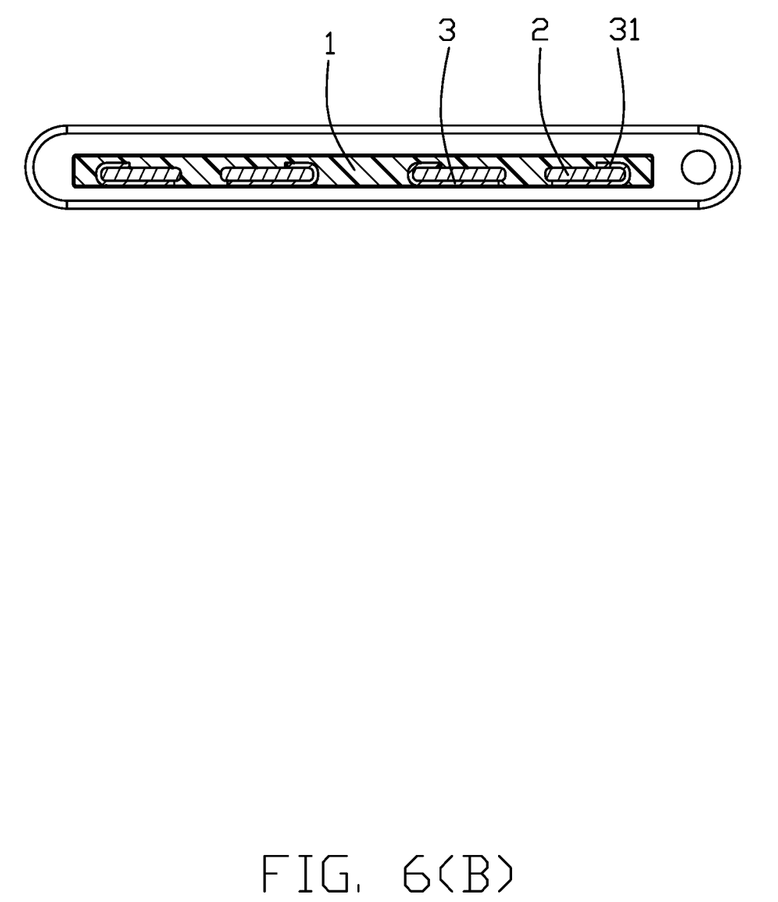
FIG. 6(B) is a cross-sectional view of the card tray of FIG. 5 along line 6(B)-6(B)
Figure 7A:
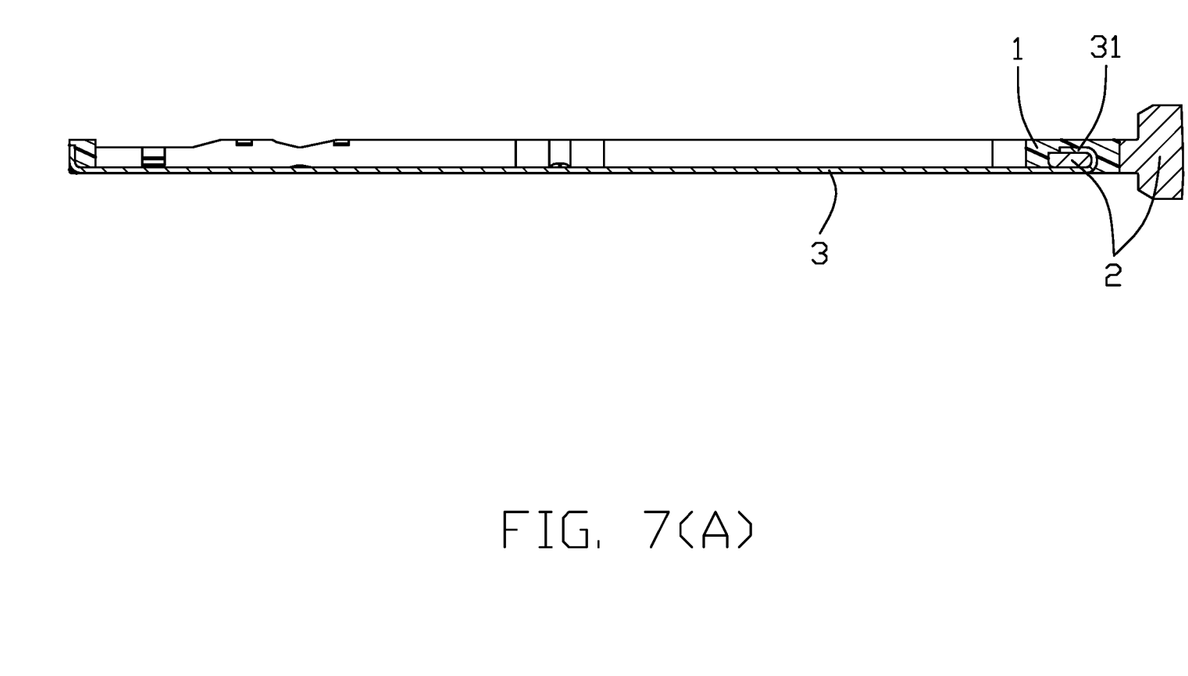
FIG. 7(A) is a cross-sectional view of the card tray of FIG. 5 along line 7(A)-7(A)
Figure 7B:
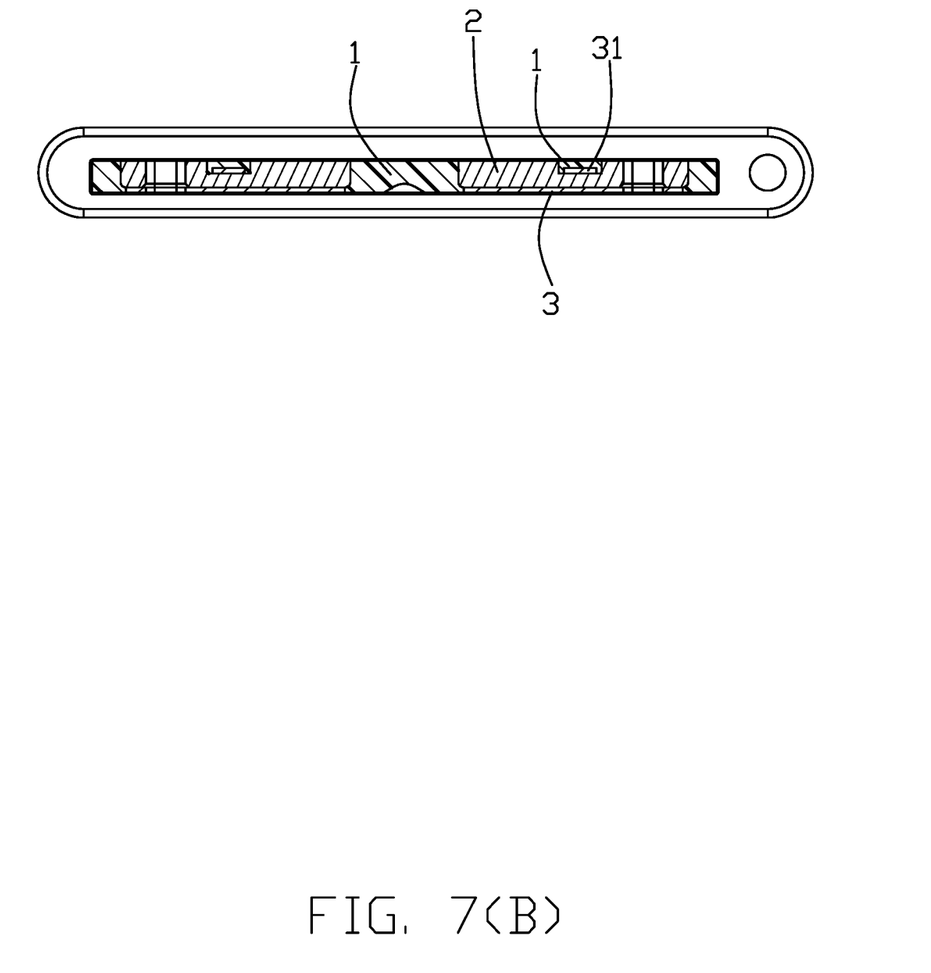
FIG. 7(B) is a cross-sectional view of the card tray of FIG. 5 along line 7(B)-7(B).

Referring to FIGS. 2-3, the card tray 100 includes an insulative base portion 1 shaping like a rectangle frame, a metallic operating portion 2 affixed to an end of the base portion 1, and a metal shell 3 insert-molded with the base portion 1. The operating portion is defined as a back end.

Referring to FIGS. 2-3, the base portion 1 includes a frame portion 11 and a division 12 configured discontinuously. The frame portion 11 has a receiving cavity 10 therein to receiving the electronic card and divided to two spaces by the division 12. The frame portion 11 has a number of holes 13 located at a rear end thereof and a pair of depressions 14 located at two sides thereof to engage with the electrical device to assemble in the electrical device stably.

The operating portion 2, made of metal materials, includes an operating door 21 and a number of protrusions 22 extending forwardly from the operating door 21 and received in the holes 13 to engage with the base portion 1.

The metal shell 3, shaping like a rectangle metal sheet body 30, is insert-molded with the base portion 1 and exposed from the receiving cavity 10. The operating door 2 and the metal shell 3 in made from metal materials. The metal shell 3 has a number of affixed legs or bending tabs 31 extending therefrom to affix to the protrusions 22 wherein the protrusion 22 is sandwiched between the sheet body 30 and the bending tab 31 in the vertical direction.

A method of making the card tray 100 includes the steps of: providing an operating portion 2 and a metal shell 3; assembling the operating portion 2 to the metal shell 3 in a riveting process; insert-molding the operating portion 2 and the metal shell 3 with the base portion 1, the base portion 1 located around the operating portion 2 and the metal shell 3 and forming a frame structure around the metal shell 3. In this embodiment, the base portion forms a pair of spaced divisions (not labeled) on two lateral sides in said transverse direction, and the shell defines an elongated rib (not labeled) between the pair of spaced divisions in the transverse direction so as to cooperate with the pair of spaced divisions to form two spaces in the receiving cavity 10 receive the electronic cards, respectively.

However, the disclosure is illustrative only, changes may be made in detail, especially in matter of shape, size, and arrangement of sections within the principles of the invention.

What is claimed is:

1. An electronic card tray comprising:

an insulative base portion essentially extending in a horizontal plane defined by a front-to-back direction and a transverse direction perpendicular to each other, said base portion forming frame portion with a receiving cavity therein for receiving an electronic card;

a metallic operating portion made by a die-casting process and integrally formed and located at a front end of the base portion via an insert-molding process so as to have the base portion protectively grasping a portion of the operating portion circumferentially, wherein said operating portion defines along the transverse direction a transverse dimension larger than another transverse dimension defined by the base portion in said transverse direction, and further defines, along a vertical direction perpendicular to said horizontal plane, a vertical dimension larger than another vertical dimension defined by the base portion; and a metallic shell made from sheet metal and mechanically secured to the operating portion before the base portion is applied thereon, wherein said shell includes a plurality of bending tabs grasping the operating portion for securing thereto, and said bending tabs are sandwiched between the base portion and the operating portion.

2. The electronic card tray as claimed in claim 1, wherein said bending tabs are sandwiched between the base portion and the operating portion in said vertical direction.

3. The electronic card tray as claimed in claim 1, wherein said bending tabs are sandwiched between the base portion and the operating portion in the front-to-back direction.

4. The electronic card tray as claimed in claim 1, wherein the base portion and the shell have a similar dimension in a top view in said vertical direction.

5. The electronic card tray as claimed in claim 1, wherein said operating portion includes an operating door which defines the said transverse dimension and said vertical dimension, and at least a protrusion which rearwardly extends from the operating door and defines a vertical dimension, in said vertical dimension, similar to that of the base portion.

6. An electronic card tray comprising:
   a metallic operating portion made by die-casting and having different thicknesses on different portions;
   a metallic shell made from sheet metal with a constant thickness thereof, located behind the operating portion in a front-to-back direction, and having a front end secured to the operating portion; and
   an insulative base portion integrally formed with both said operating portion and said shell via an insert-molding process; wherein
      the shell includes a sheet body with a bending tab extending therefrom and cooperating the sheet body to sandwich a protrusion of the operating portion therebetween; and
      said bending tab is further sandwiched between the protrusion of the operating portion and the base portion.

7. The electronic card tray as claimed in claim 6, the bending tab is sandwiched between the protrusion of the operating portion and the base portion in a vertical direction.

8. The electronic card tray as claimed in claim 7 wherein the bending tab is sandwiched between the protrusion of the operating portion and the base portion in a transverse direction perpendicular to said vertical direction.

9. The electronic card tray as claimed in claim 6, wherein a portion of the protrusion is received within a hole formed in the base portion.

10. The electronic card tray as claimed in claim 6, wherein said operating portion includes an operating door from which the protrusion extends, said operating door being larger than the protrusion in a vertical direction.

* * * * *